US006956767B2

(12) United States Patent
Kang

(10) Patent No.: US 6,956,767 B2
(45) Date of Patent: Oct. 18, 2005

(54) NONVOLATILE MEMORY DEVICE USING SERIAL DIODE CELL

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/049,647

(22) Filed: Feb. 4, 2005

(65) Prior Publication Data

US 2005/0174839 A1 Aug. 11, 2005

(30) Foreign Application Priority Data

Feb. 5, 2004 (KR) ...................... 10-2004-0007559

(51) Int. Cl.[7] ............................................... G11C 11/36
(52) U.S. Cl. ....................... 365/175; 365/145; 365/149
(58) Field of Search ................................ 365/175, 145, 365/149, 117, 171, 189.11

(56) References Cited

U.S. PATENT DOCUMENTS 4,066,915 A 1/1978 Ohhinata
4,677,455 A 6/1987 Okajima
4,882,706 A 11/1989 Sinclair
6,229,161 B1 5/2001 Nemati et al.
6,272,594 B1 8/2001 Gupta et al.
6,363,439 B1 3/2002 Battles et al.
6,426,891 B1 * 7/2002 Katori ........................ 365/175
2004/0109340 A1 * 6/2004 Kang ......................... 365/145

FOREIGN PATENT DOCUMENTS

KR 1020030024223 A 3/2003

* cited by examiner

*Primary Examiner*—Anh Phung
*Assistant Examiner*—Dang T. Nguyen
(74) *Attorney, Agent, or Firm*—Heller Ehrman LLP

(57) ABSTRACT

A nonvolatile memory device using a serial diode cell comprises a plurality of serial diode switch cell arrays each having a hierarchical bit line structure including a main bit line and a sub bit line. Each of the plurality of sub cell arrays is embodied as a cross point cell, thereby reducing the whole memory size. Specifically, a unit serial diode cell comprising a nonvolatile ferroelectric capacitor and a serial diode switch which does not require an additional gate control signal is located where a word line and a sub bit line are crossed, thereby reducing the whole chip size.

13 Claims, 12 Drawing Sheets

NONVOLATILE MEMORY DEVICE USING SERIAL DIODE CELL

BACKGROUND OF THE INVENTION

1. Field of the Invention

The present invention generally relates to a nonvolatile memory device using a serial diode cell, and more specifically, to a technology of providing a plurality of sub cell arrays each as a cross point cell having in a hierarchical bit line structure including a main bit line and a sub bit line, thereby reducing the whole size of a chip.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of the conventional FeRAM comprises a switching device and a nonvolatile ferroelectric capacitor which is connected between one terminal of the switching device and a plate line. The switching device performs a switching operation depending on a state of a word line to connect the nonvolatile ferroelectric capacitor to a sub bit line.

Here, the switching device of the conventional FeRAM is generally a NMOS transistor whose switching operation is controlled by a gate control signal. However, when a cell array is embodied by using the above-described NMOS transistor as a switching device, the whole chip size increases.

As a result, it is necessary to embody a sub cell array comprising the above-described nonvolatile ferroelectric memory device and a serial diode switch which does not require an additional gate control signal as a cross point cell having a hierarchical bit line structure including a main bit line and a sub bit line.

SUMMARY OF THE INVENTION

Accordingly, it is an object of the present invention to provide a sub cell array using a serial diode switch which does not require an additional gate control signal in a hierarchical bit line structure including a main bit line and a sub bit line, thereby reducing the whole memory size.

It is another object of the present invention to effectively drive read/write operations in the sub cell array using a serial diode switch, thereby improving operation characteristics of memory cells.

In an embodiment, a nonvolatile memory device using a serial diode cell comprises a plurality of serial diode cell arrays, a plurality of word line driving units and a plurality of sense amplifiers. Each of the plurality of serial diode cell arrays has a hierarchical bit line structure including a main bit line and a sub bit line, and includes a sub cell array having a plurality of unit serial diode cells arranged in row and column directions between a word line and the sub bit line. The plurality of word line driving units selectively drive the word lines of the plurality of serial diode cell arrays. The plurality of sense amplifiers sense and amplify data applied from the plurality of serial diode cell arrays. Here, each of the plurality of the serial diode cells comprises a nonvolatile ferroelectric capacitor whose one terminal is connected to the word line, and a serial diode switch which includes at least two or more diode devices successively connected in series between the sub bit line and the other terminal of the nonvolatile ferroelectric capacitor and is selectively switched depending on a voltage applied to the word line and the sub bit line.

In another embodiment, a nonvolatile memory device using a serial diode cell comprises a plurality of serial diode cell arrays. Each of the plurality of serial diode cell arrays has a hierarchical bit line structure including a main bit line and a sub bit line, and includes a sub cell array having a plurality of unit serial diode cells arranged in row and column directions between a word line and the sub bit line. Here, the sub cell array comprises a unit serial diode cell, a pull-up/pull-down driving switch, a first driving switch unit and a second driving switch unit. The unit serial diode cell includes a nonvolatile ferroelectric capacitor whose one terminal is connected to the word line, and a serial diode switch which includes at least two or more diode devices successively connected in series between the sub bit line and the other terminal of the nonvolatile ferroelectric capacitor and is selectively switched depending on a voltage applied to the word line and the sub bit line. The pull-up/pull-down driving switch pulls up or pulls down the plurality of sub bit lines. The first driving switch unit controls connection between the main bit line and the sub bit line. The second driving switch unit pulls down the main bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
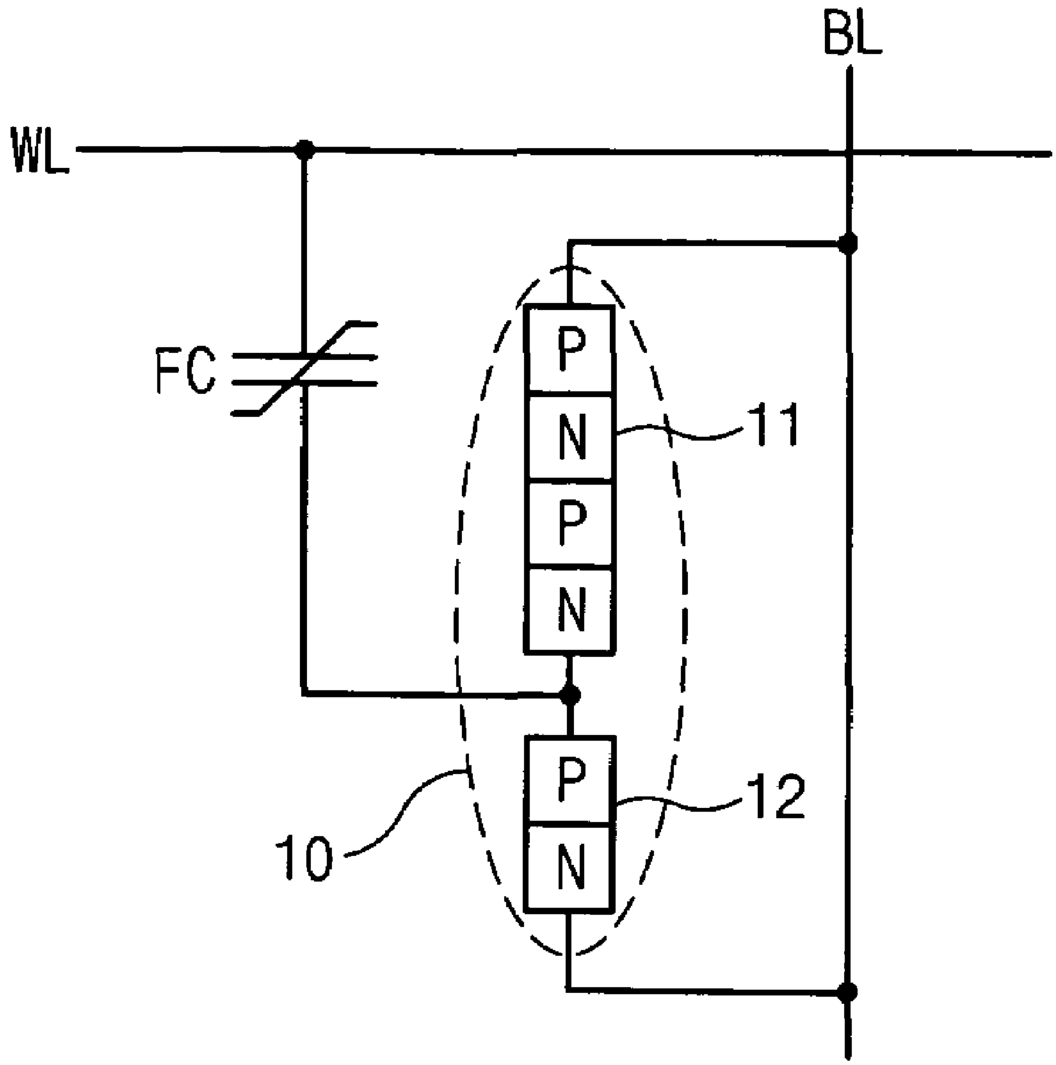
FIG. 1 is a diagram illustrating a serial diode cell according to an embodiment of the present invention.

FIG. 1 is a diagram illustrating a serial diode cell according to an embodiment of the present invention.

In an embodiment, a unit serial diode cell comprises a nonvolatile ferroelectric capacitor FC and a serial diode switch 10. Here, the serial diode switch 10 includes a PNPN diode switch 11 and a PN diode switch 12. The PNPN diode switch 11 and the PN diode switch 12 are connected in parallel between a bit line BL and a bottom electrode of the nonvolatile ferroelectric capacitor FC.

The PNPN diode switch 11 is connected backward between the bit line BL and one electrode of the nonvolatile ferroelectric capacitor FC, and the PN diode switch 12 is connected forward between the bit line BL and one electrode of the nonvolatile ferroelectric capacitor FC. The other electrode of the nonvolatile ferroelectric capacitor FC is connected to a word line WL.

In a hierarchical bit line structure including a main bit line MBL and a sub bit line SBL, it is supposed that the above-described bit line BL is the same as a sub bit line SBL described later.

Figure 2:
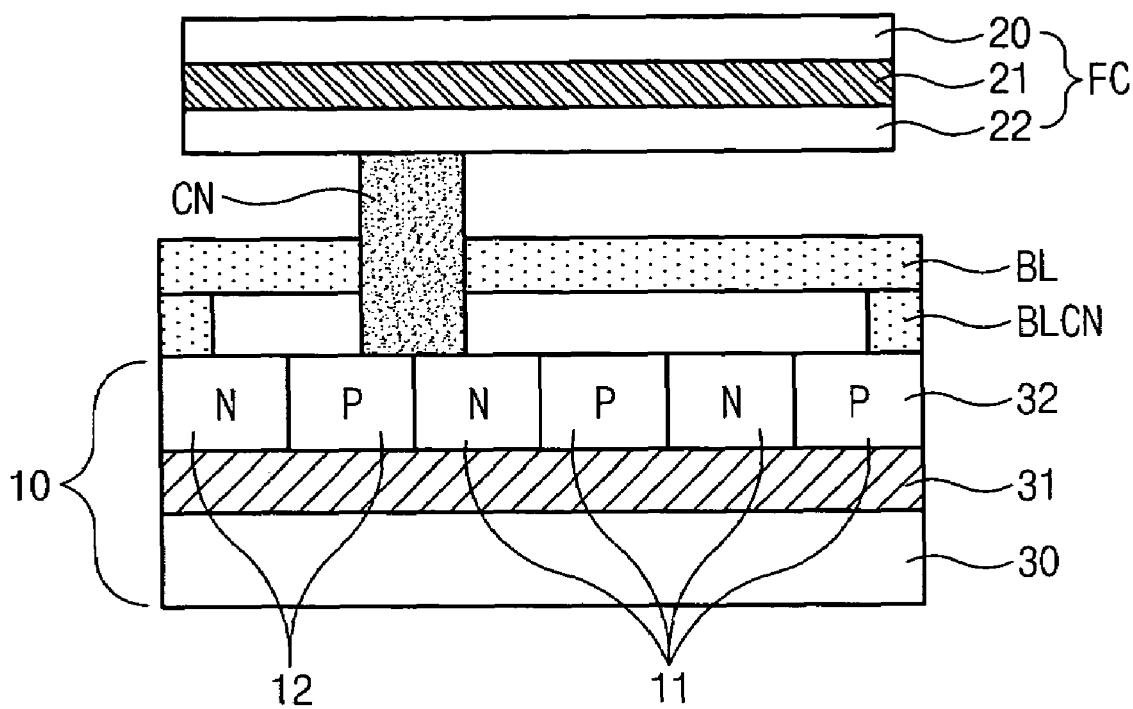
FIG. 2 is a cross-sectional diagram illustrating the serial diode cell of FIG. 1.

FIG. 2 is a cross-sectional diagram illustrating the serial diode cell of FIG. 1.

The serial diode switch 10 comprises an insulating layer 31 formed on a silicon substrate 30 and a silicon layer 32 formed on the insulating layer 31, to have a SOI (Silicon On Insulator) structure. Here, the insulating layer 31 made of $SiO_2$ is deposited on the silicon substrate 30, and the silicon layer 32 is formed on the insulating layer 31. The silicon layer 32 forms a diode chain including the PNPN diode switch 11 and the PN diode switch 12 which are connected serially. The diode switches 11 and 12 are made of growth silicon or polysilicon.

The PNPN diode switch 11 includes a plurality of P-type regions and N-type regions which are alternately connected in series. The PN diode switch 12 includes a P-type region and a N-type region which are connected serially to the adjacent N-type region of the PNPN diode switch 11.

The bit line BL is formed through a bit line contact node BLCN on the N-type region of the PN diode switch 12 and the P-type region of the PNPN diode switch 11. Also, the P-type region of the PN diode switch 12 and the N-type region of the PNPN diode switch 11 are connected to a bottom electrode 22 of the nonvolatile ferroelectric capacitor FC through a common contact node CN.

Here, the nonvolatile ferroelectric capacitor FC comprises a top electrode 20, a ferroelectric layer 21 and a bottom electrode 22. The top electrode 20 of the nonvolatile ferroelectric capacitor FC is connected to the word line WL.

Figure 3:
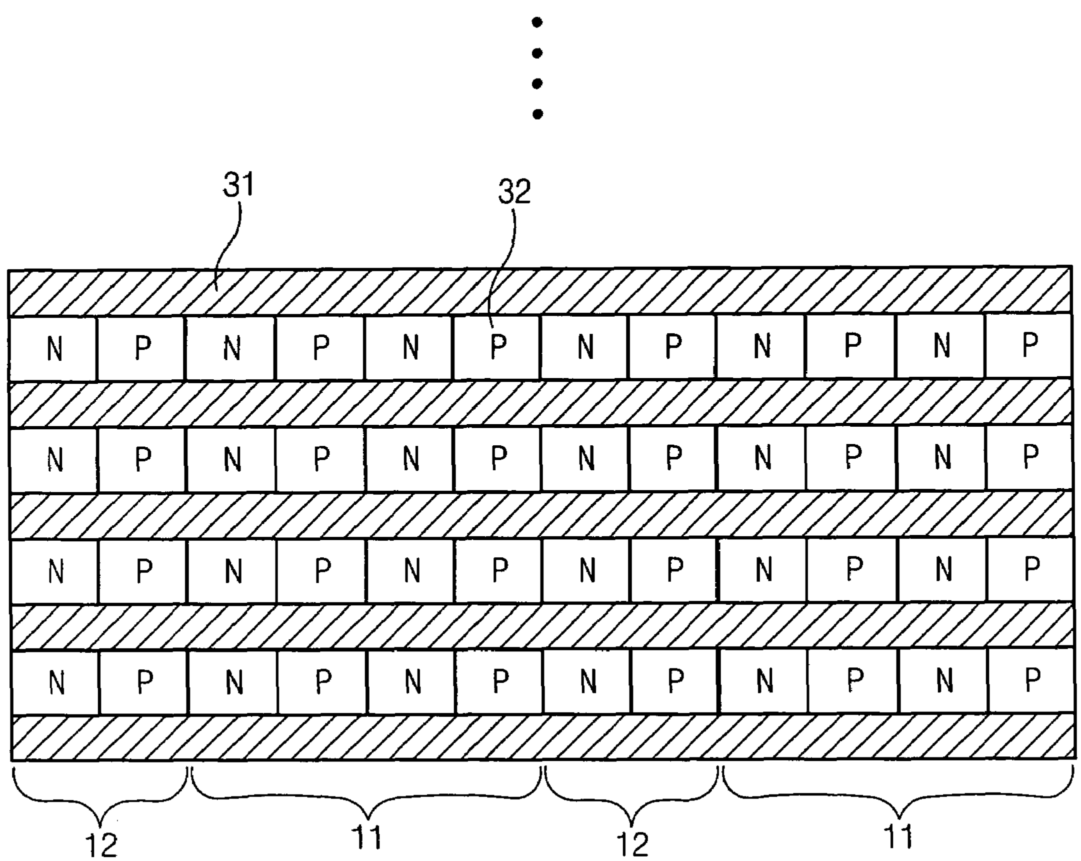
FIG. 3 is a plane diagram illustrating a serial diode switch of FIG. 1.

FIG. 3 is a plane diagram illustrating a serial diode switch 10 of FIG. 2.

The serial diode switch 10 includes the PNPN diode switch 11 and the PN diode switch 12 which are formed of the silicon layer 32 and successively connected with a serial chain type. That is, one serial diode cell comprises the PN diode switch 12 and the PNPN diode switch 11 which are connected serially. A serial diode cell adjacent to the one serial diode cell in the same direction includes the PN diode switch 12 and the PNPN diode switch 11 which are connected serially.

The serial diode switches 10 is arranged as a plurality of layers and the upper serial diode switch 10 and the lower serial diode switch 10 are separated by the insulating layer 31.

As a result, one serial diode cell region is configured by selecting one PN diode switch 12 and one PNPN diode switch 11 from diode devices connected in series.

Figure 4:
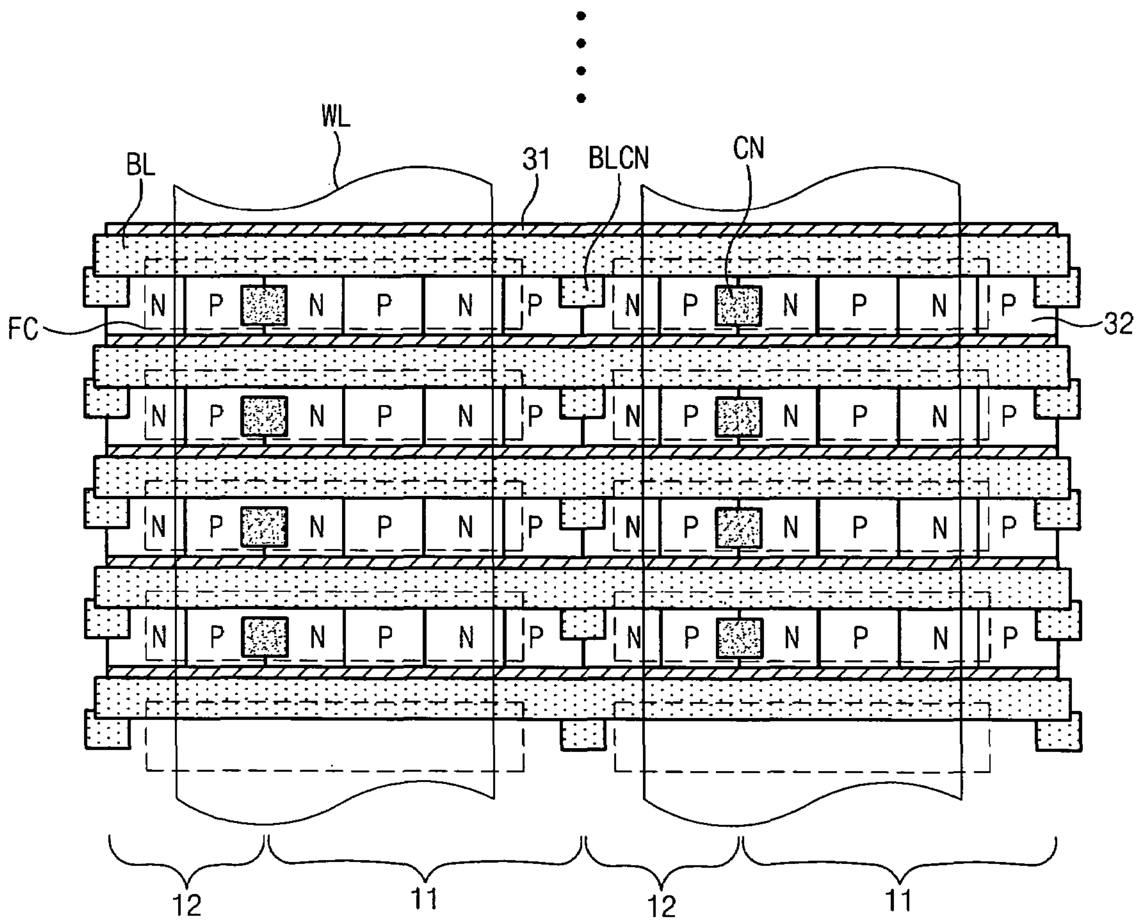
FIG. 4 is a plane diagram illustrating the serial diode cell of FIG. 1.

FIG. 4 is a plane diagram illustrating the serial diode cell of FIG. 1.

The silicon layer 32 made of growth silicon or polysilicon forms the PNPN diode switch 11 and the PN diode switch 12 which are connected serially. In each silicon layer 32, its upper and lower portions are insulated through the insulating layer 31. In the serial diode switch 10, the P-type region of the PN diode switch 12 is formed adjacent to the N-type region of the PNPN diode switch 11 to be connected in common to a contact node CN of the nonvolatile ferroelectric capacitor FC.

Also, the N-type region of the PN diode switch 12 and the P-type region of the PNPN diode switch 11 are connected to the bit line BL through the bit line contact node BLCN. The bit line contact node BLCN is connected in common to the bit line contact node BLCN of the adjacent serial diode cell. That is, the same bit line contact node BLCN is connected in common to the P-type region of the PNPN diode switch 11 and the N-type region of the adjacent PN diode switch 12.

A word line WL is formed on the nonvolatile ferroelectric capacitor FC.

Figure 5:
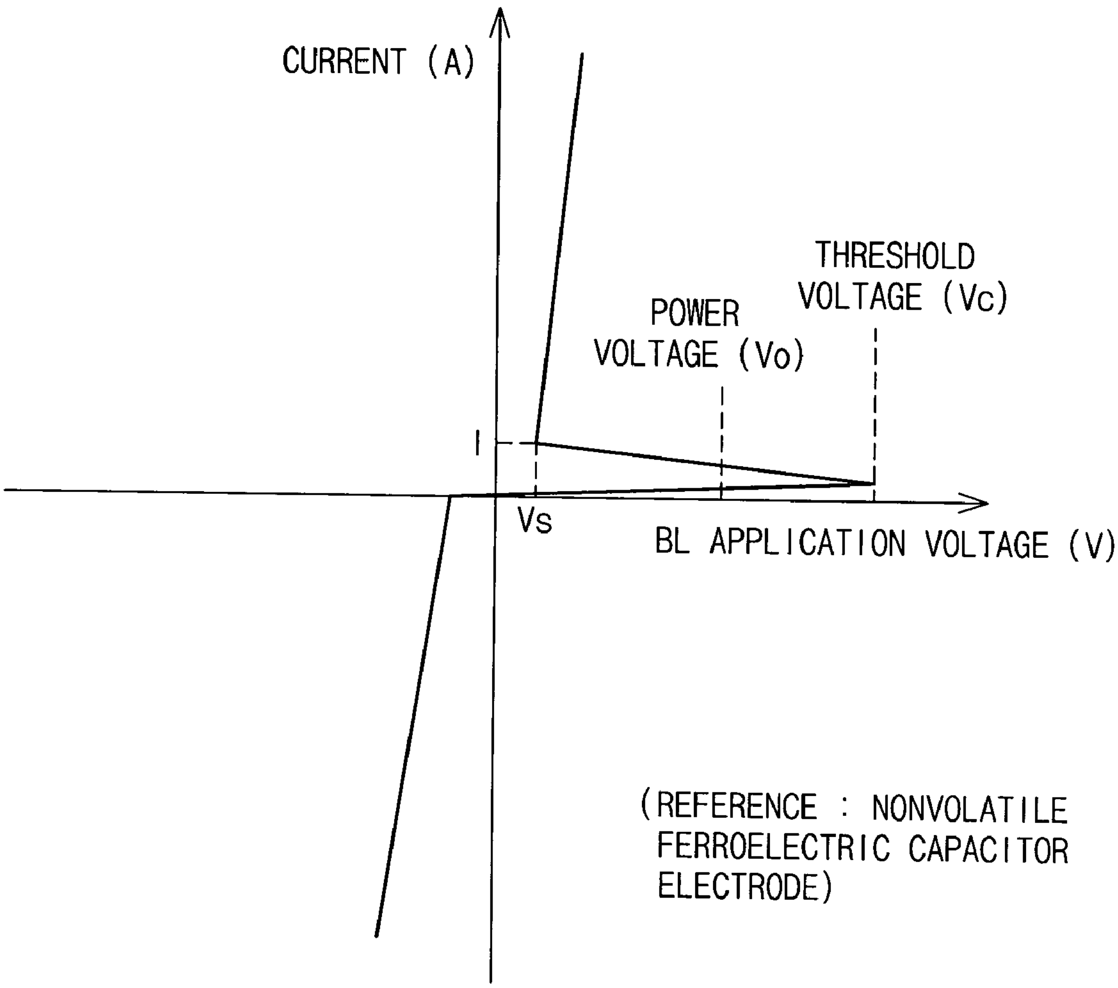
FIG. 5 is a diagram illustrating the operation of the serial diode switch of FIG. 1.

FIG. 5 is a diagram illustrating the operation of the serial diode switch 10 of FIG. 1.

When a voltage applied to the bit line BL increases in a positive direction based on the nonvolatile ferroelectric capacitor FC, the serial diode switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the serial diode switch 10 is turned on, so that current dramatically increases. Here, when the voltage applied to the bit line BL is over the threshold voltage Vc, a value of current I depends on that of a resistor (not shown) which serves as load connected to the bit line BL.

A large amount of current can flow even when a low voltage Vs applied to the bit line BL after the PNPN diode switch 11 is turned on. Here, the PN diode switch 10 is kept off by the backward operation characteristic.

On the other hand, if the voltage applied to the bit line BL increases in a negative direction based on the nonvolatile ferroelectric capacitor FC, that is, when a constant voltage is applied to the word line WL, the serial diode switch 10 is turned on by the forward operation characteristic of the PN diode switch 12, so that current flows in a random operating voltage. Here, the PNPN diode switch 11 is kept off by the backward operation characteristic.

Figure 6A:
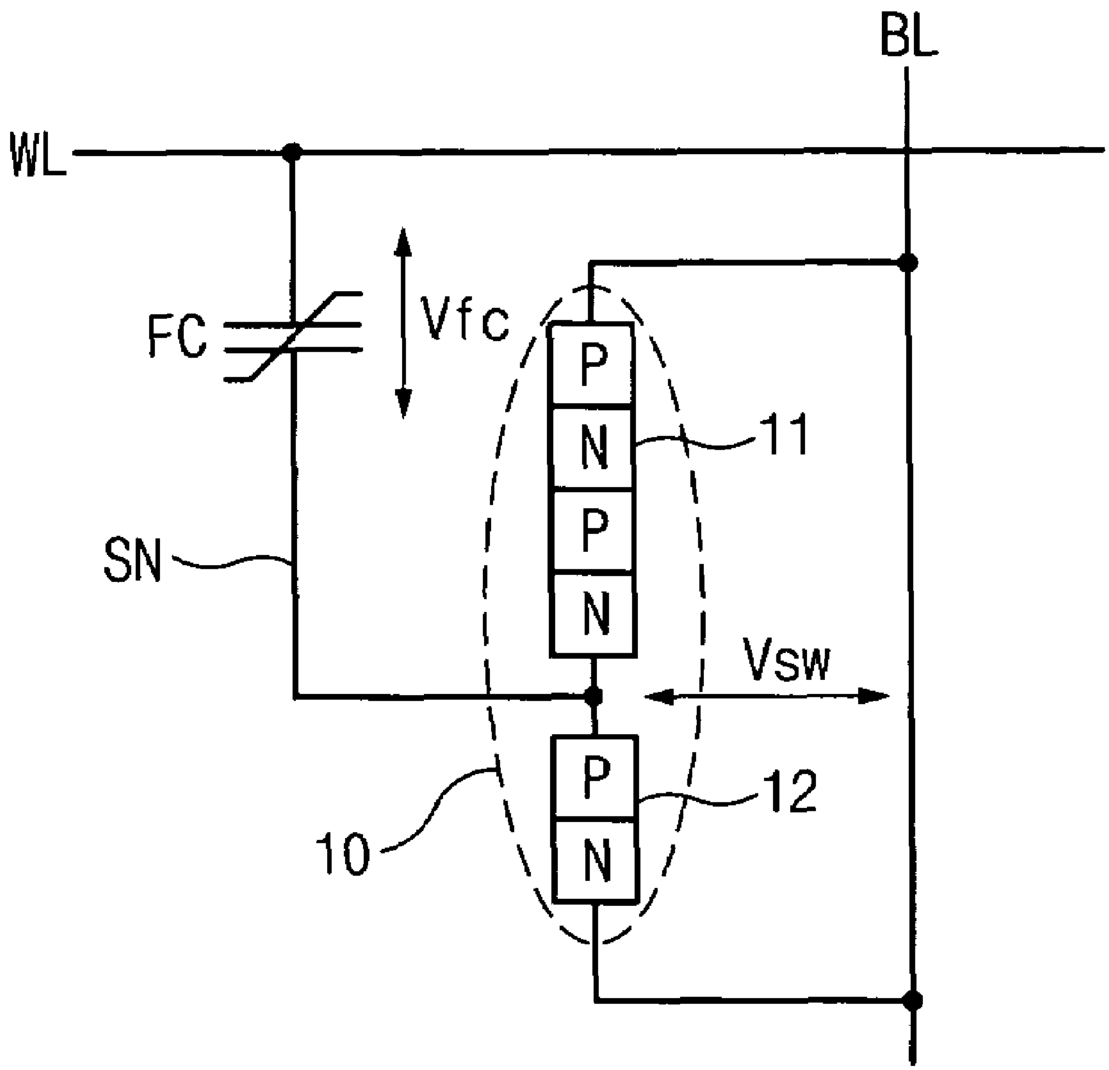
FIGS. 6*a* to 6*c* are diagrams illustrating the voltage dependency of a word line and a bit line in a nonvolatile memory device using a serial diode cell according to an embodiment of the present invention.
Figure 6B:
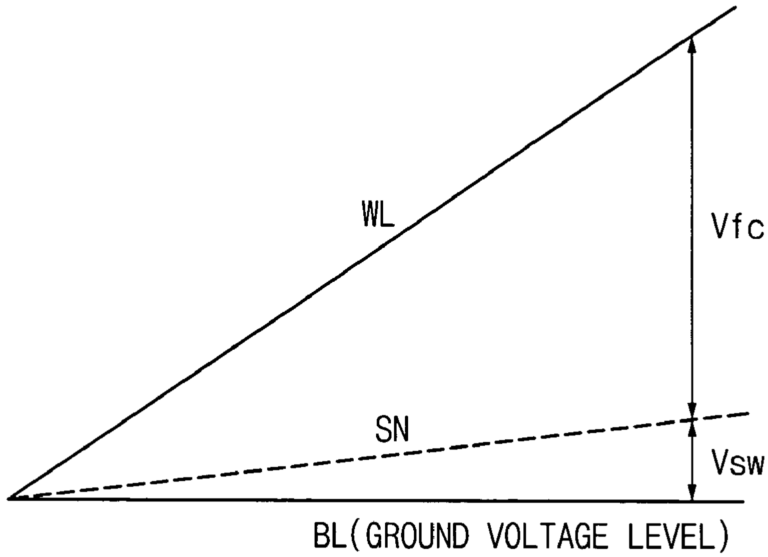
Figure 6C:
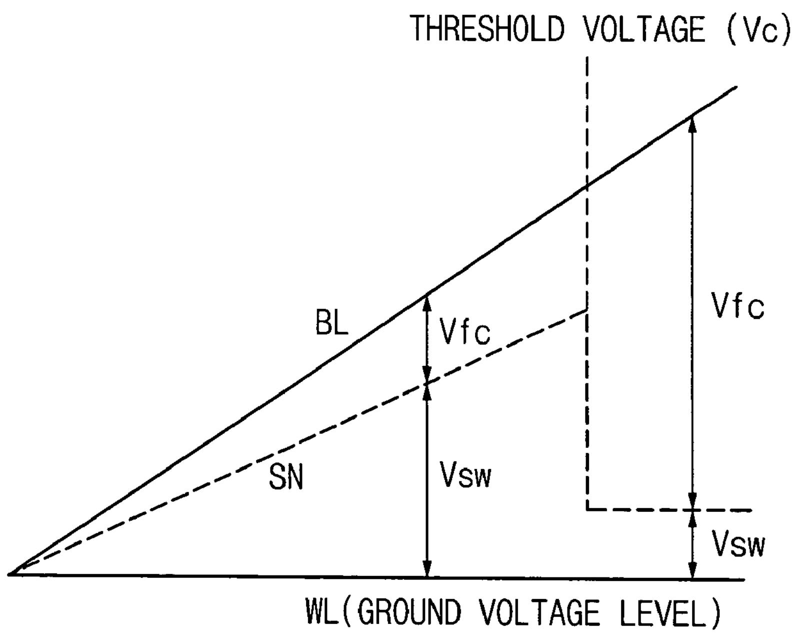

FIGS. 6*a* to 6*c* are diagrams illustrating the voltage dependency of the word line WL and the bit line BL in a nonvolatile memory device using a serial diode cell according to an embodiment of the present invention.

Referring to FIG. 6*a*, a voltage flowing in the nonvolatile ferroelectric capacitor FC connected between the word line WL and a node SN refers to a voltage Vfc, and a voltage flowing in the serial diode switch 10 connected between the node SN and the bit line BL refers to a voltage Vsw.

FIG. 6*b* is a diagram illustrating the voltage dependency of the word line WL in the serial diode cell according to an embodiment of the present invention.

When a voltage of the word line WL increases while a voltage of the bit line BL is fixed at a ground voltage level, the voltage of the word line WL is distributed in the nonvolatile ferroelectric capacitor FC and the serial diode switch 10.

That is, when the voltage of the word line WL increases while the voltage of the bit line BL is at the ground level, the PN diode switch 12 of the serial diode switch 10 is turned on in a low voltage, so that current flows.

Here, the voltage Vsw applied to the serial diode switch 10 has a low voltage value by the forward operation of the PN diode switch 12. On the other hand, the voltage Vfc applied to the nonvolatile ferroelectric capacitor FC has a high voltage value, thereby improving the operation characteristic.

FIG. 6*c* is a diagram illustrating the voltage dependency of the bit line BL in the serial diode cell according to an embodiment of the present invention.

When the voltage of the bit line BL increases while the voltage of the word line WL is fixed at the ground voltage level, the voltage of the bit line BL is distributed in the nonvolatile ferroelectric capacitor FC and the serial diode switch 10.

That is, when the voltage of the bit line BL increases while the voltage of the word line WL is at the ground level, the PNPN diode switch 11 of the serial diode switch 10 is kept off before the voltage of the bit line BL reaches the threshold voltage Vc. The PN diode switch 12 of the serial diode switch 10 is kept off by its backward operation characteristic. As a result, the voltage Vsw applied to the serial diode switch 10 has a high voltage value.

On the other hand, when the serial diode switch 10 is at a turn-off state, the voltage Vfc applied to the nonvolatile ferroelectric capacitor FC has a low voltage value. As a result, data stored in the nonvolatile ferroelectric capacitor Fc is not changed, so that the operation is kept at a stationary state.

Thereafter, when the voltage of the bit line BL rises to be over the threshold voltage Vc, the PNPN diode switch 11 of the serial diode switch 10 is turned on. As a result, most of the bit line BL voltage is distributed to the nonvolatile ferroelectric capacitor FC to increase the voltage Vfc, so that new data can be written in the nonvolatile ferroelectric capacitor FC.

Figure 7:
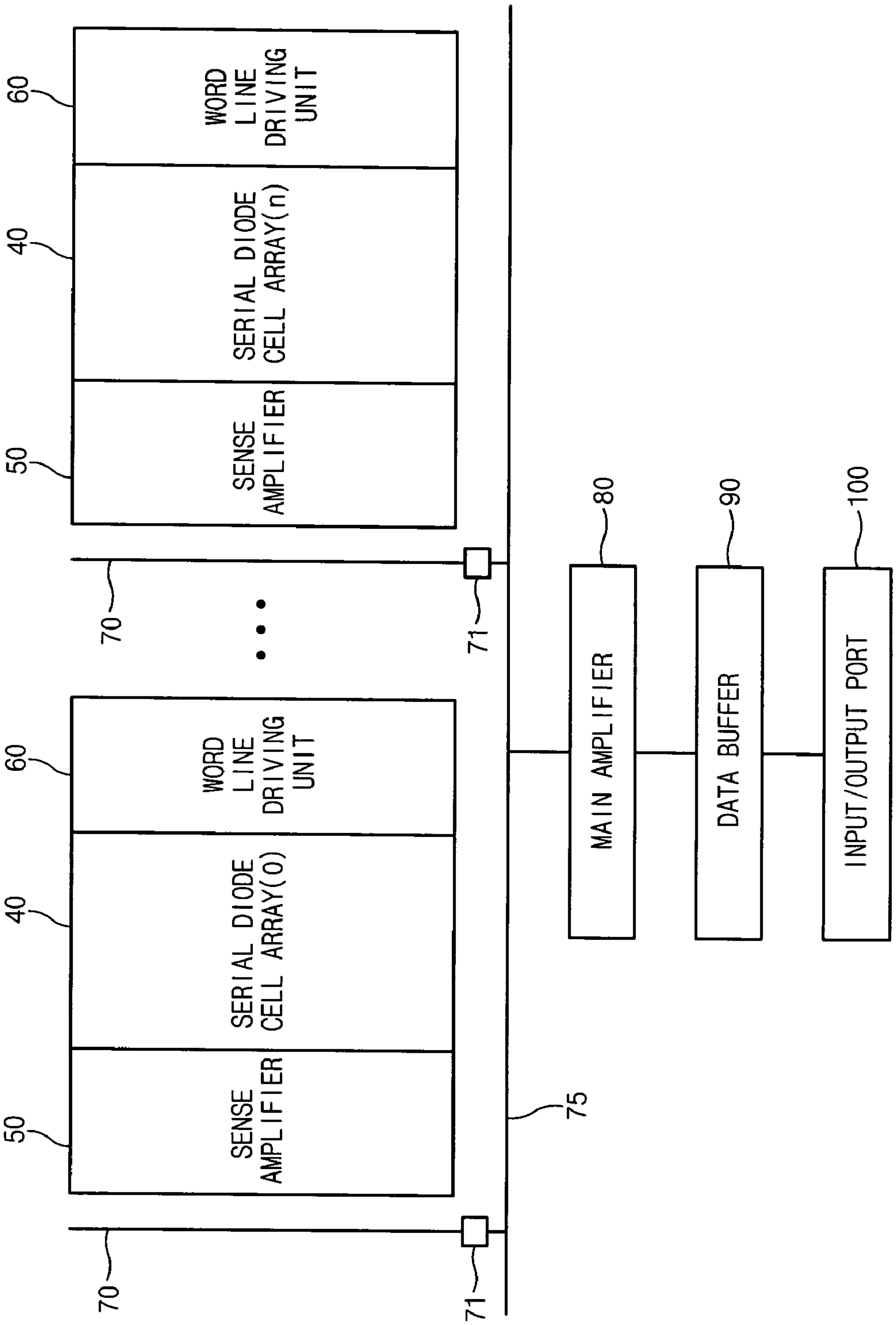
FIG. 7 is a diagram illustrating a nonvolatile memory device using a serial diode cell according to an embodiment of the present invention.

FIG. 7 is a diagram illustrating a nonvolatile memory device using a serial diode cell according to an embodiment of the present invention.

In an embodiment, the nonvolatile memory device comprises a plurality of serial diode cell arrays 40, a plurality of sense amplifiers 50, a plurality of word line driving units 60, a plurality of local data buses 70, a plurality of data bus switches 71, a global data bus 75, a main amplifier 80, a data buffer 90 and an input/output port 100.

Each serial diode cell array 40 comprises a plurality of unit serial diode cells of FIG. 1 arranged in row and column directions. A plurality of word lines WL arranged in the row direction are connected to the word line driving unit 50. A plurality of bit lines BL arranged in the column direction are connected to the sense amplifier 60.

Here, one serial diode cell array 40 is correspondingly connected to one word line driving unit 60 and one sense amplifier 50.

One sense amplifier 50 connected to one local data bus 70 amplifies data applied from the serial diode cell array 40 and outputs amplified data to the local data bus 70. The plurality of data bus switches 71 connected one by one to the plurality of local data buses 70 select one of the plurality of local data buses 70 to be connected to the global data bus 75.

The plurality of local data buses 70 share one global data bus 75. The global data bus 75 is connected to the main amplifier 80, and the main amplifier 80 amplifies data applied from each sense amplifier 50 through the global data bus 75.

The data buffer 90 buffers the amplified data applied from the main amplifier 80. The input/output port 100 externally outputs output data applied from the data buffer 90, and applies externally applied input data to the data buffer 90.

Figure 8:
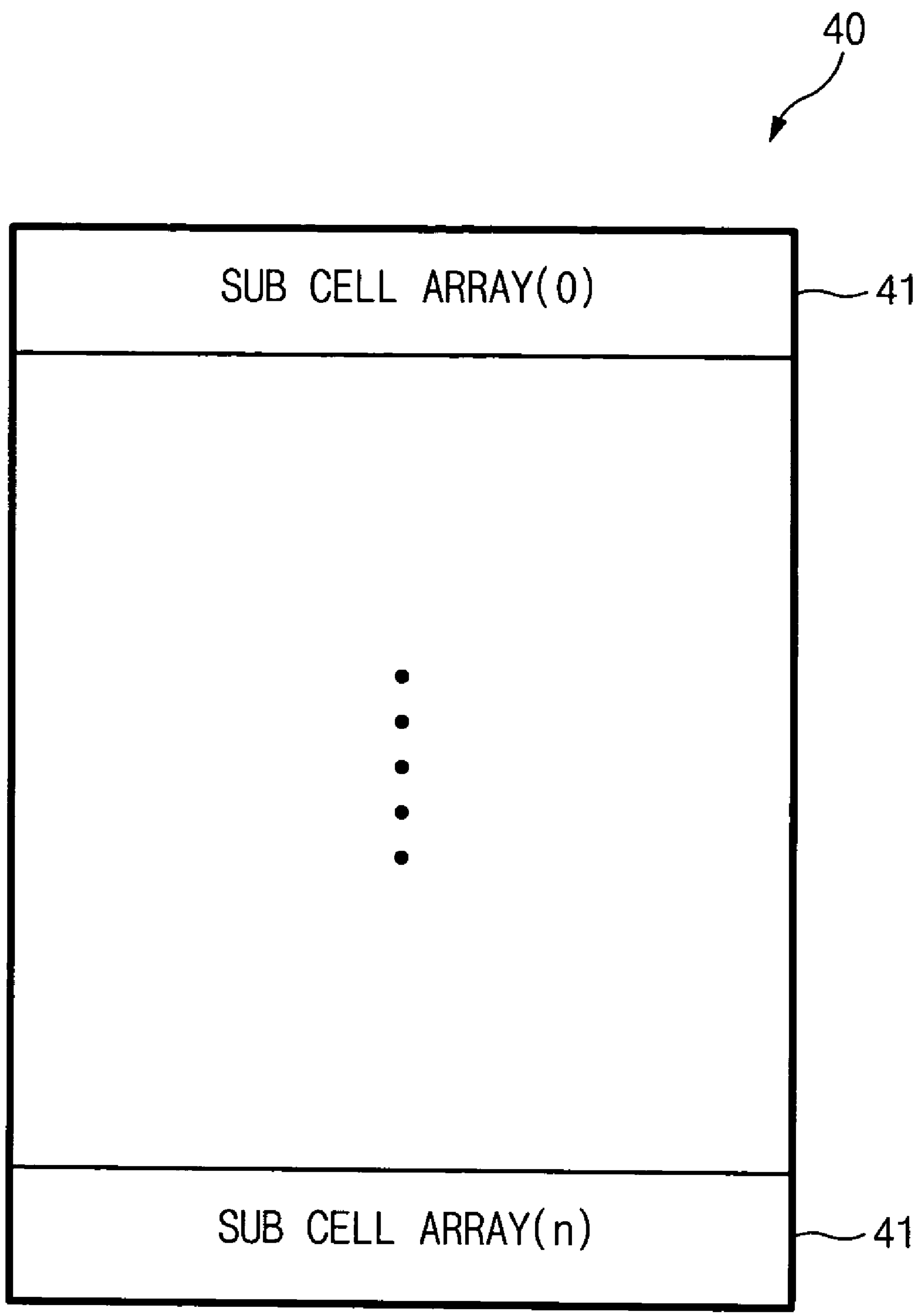
FIG. 8 is a diagram illustrating a serial diode cell array of FIG. 7.

FIG. 8 is a diagram illustrating the serial diode cell array 40 of FIG. 7.

The serial diode cell array 40 comprises a plurality of sub cell arrays 41 as shown in FIG. 8.

Figure 9:
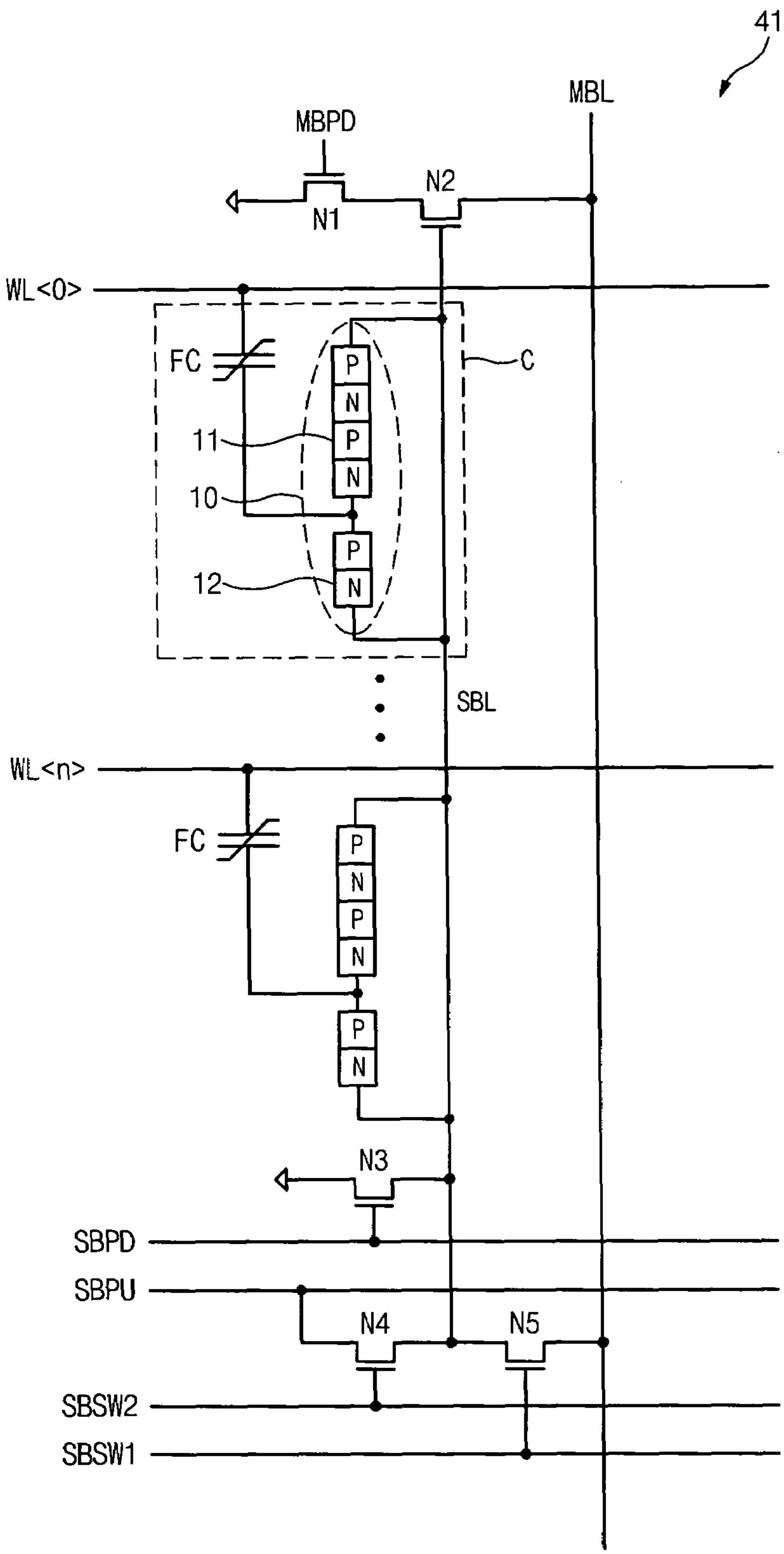
FIG. 9 is a circuit diagram illustrating a sub cell array of FIG. 8.

FIG. 9 is a circuit diagram illustrating the sub cell array 41 of FIG. 8.

The sub cell array 41 has a hierarchical bit line structure including a main bit line MBL and a sub bit line SBL. Each main bit line MBL of the sub cell array 41 is selectively connected to one of the sub bit lines SBL. That is, when one of a plurality of sub bit line selecting signals SBSW1 is activated, a corresponding NMOS transistor N5 is turned on to activate one sub bit line SBL. Also, a plurality of unit serial diode cells C are connected to one sub bit line SBL.

When a sub bit line pull-down signal SBPD is activated to turn on a NMOS transistor N3, the sub bit line SBL is pulled down to the ground level. The sub bit line pull-up signal SBPU is to control power supplied to the sub bit line SBL. That is, a voltage higher than a power voltage VCC is generated in a low voltage and supplied to the sub bit line SBL.

A NMOS transistor N4 controls connection between a sub bit line pull-up signal SBPU terminal and the sub bit line SBL in response to a sub bit line selecting signal SBSW2.

A NMOS transistor N2, connected between a NMOS transistor N1 and the main bit line MBL, has a gate connected to the sub bit line SBL. The NMOS transistor N1 connected between a ground voltage terminal and the NMOS transistor N2, has a gate to receive a main bit line pull-down signal MBPD, thereby regulating a sensing voltage of the main bit line MBL.

Here, the serial diode cell array 40 includes a plurality of word lines WL arranged in the row direction and a plurality of sub bit lines SBL arranged in the column direction, which does not require additional plate lines. Since the unit serial diode cell C is located where the word line WL and the sub bit line SBL are crossed, a cross point cell can be embodied which does not an additional area.

Here, the cross point cell does not comprise a NMOS transistor which uses a word line WL gate control signal. In the cross point cell, the nonvolatile ferroelectric capacitor FC is located at the cross point where the sub bit line SBL and the word line WL are crossed by using the serial diode switch 10 that comprises two connection electrode nodes.

Figure 10:
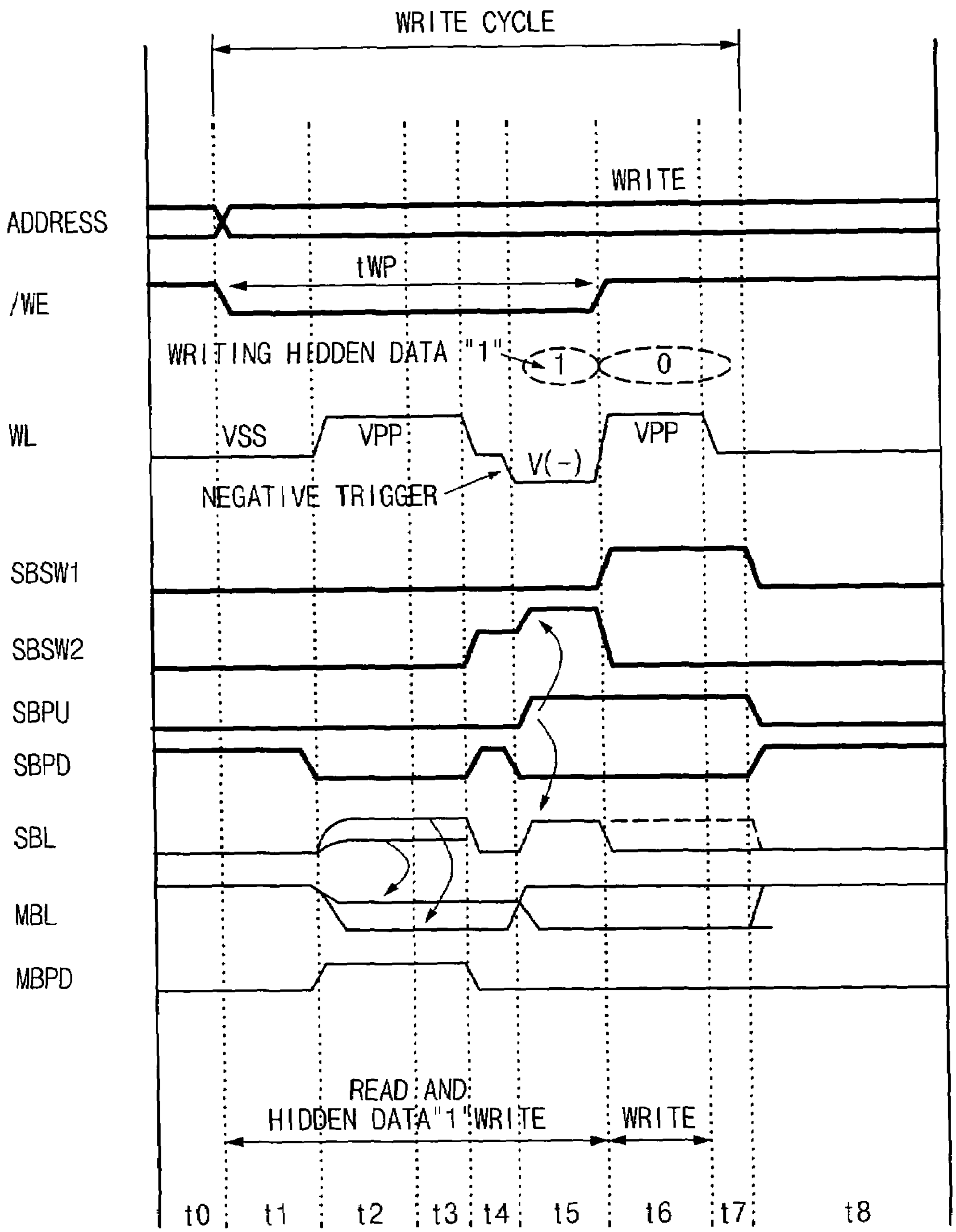
FIG. 10 is a timing diagram illustrating the write mode of the nonvolatile memory device using a serial diode cell according to an embodiment of the present invention.

FIG. 10 is a timing diagram illustrating the write mode of the nonvolatile memory device using a serial diode cell according to an embodiment of the present invention.

When a period t1 starts, if an address is inputted and a write enable signal /WE is disabled to 'low', the operation becomes at a write mode active state. In periods t0 and t1, the sub bit line pull-down signal SBPD is activated to apply the ground voltage to the sub bit line SBL, so that the sub bit line SBL is precharged to the ground level before the word line WL is activated.

Thereafter, when a period t2 starts, if the word line WL is transited to 'high', data of the serial diode cell C are transmitted to the sub bit line SBL and the main bit line MBL. Here, the sub bit line pull-down signal SBPD is transited to 'low', and the main bit line pull-down signal MBPD is transited to 'high'. As a result, voltage levels of the sub bit line SBL and the main bit line MBL rise.

Then, when a period t4 starts, if the word line WL is transited to the ground level and the sub bit line pull-down signal SBPD is enabled, the sub bit line SBL is precharged to the ground level. Here, if the sub bit line selecting signal SBW2 is enabled, the NMOS transistor N4 is turned on to pull down the sub bit line. SBL to the ground level. If the main bit line pull-down signal MBPD is transited to 'low', the voltage level of the main bit line MBL is maintained as it is.

In a period t5, the voltage of the word line WL is transited to a negative voltage. That is, a difference between the low voltage level of the sub bit line SBL and the negative voltage level of the word line WL does not reach the state of the threshold voltage Vc to turn on the PNPN diode switch 11 of the serial diode switch 10.

However, if the sub bit line pull-up signal SBPU and the sub bit line selecting signal SBSW2 are transited to 'high', the voltage of the sub bit line SBL is amplified to 'high'. A voltage over the threshold voltage Vc to turn on the PNPN diode switch 11 is applied to the serial diode cell C depending on the difference between the high amplification voltage of the sub bit line SBL and the negative voltage of the word line WL. As a result, the PNPN diode switch 11 is turned on, and high data is written in the nonvolatile ferroelectric capacitor FC of the serial diode cell C.

Here, in the period t5, hidden data "1" is written because all high data regard less of external data are written in the serial diode cell C connected to the driving word line WL.

Next, when a period t6 starts, if the write enable signal /WE is transited to 'high', the operation becomes at a read mode active state. Here, the voltage level of the word line WL rises to a pumping voltage VPP level, and the sub bit line SBL is connected to the main bit line MBL when the sub bit line selecting signal SBSW1 is transited to 'high'.

At this state, when the voltage of the sub bit line SBL is transited to 'low', data "0" is written in the serial diode cell C. On the other hand, when the voltage of the sub bit line SBL is transited to 'high', the high data written in the period t5 is maintained as it is, so that the data "1" is written in the serial diode cell C. Here, the sub bit line selecting signal SBSW2 is transited to. 'low', so that external data can be written in the cell.

Figure 11:
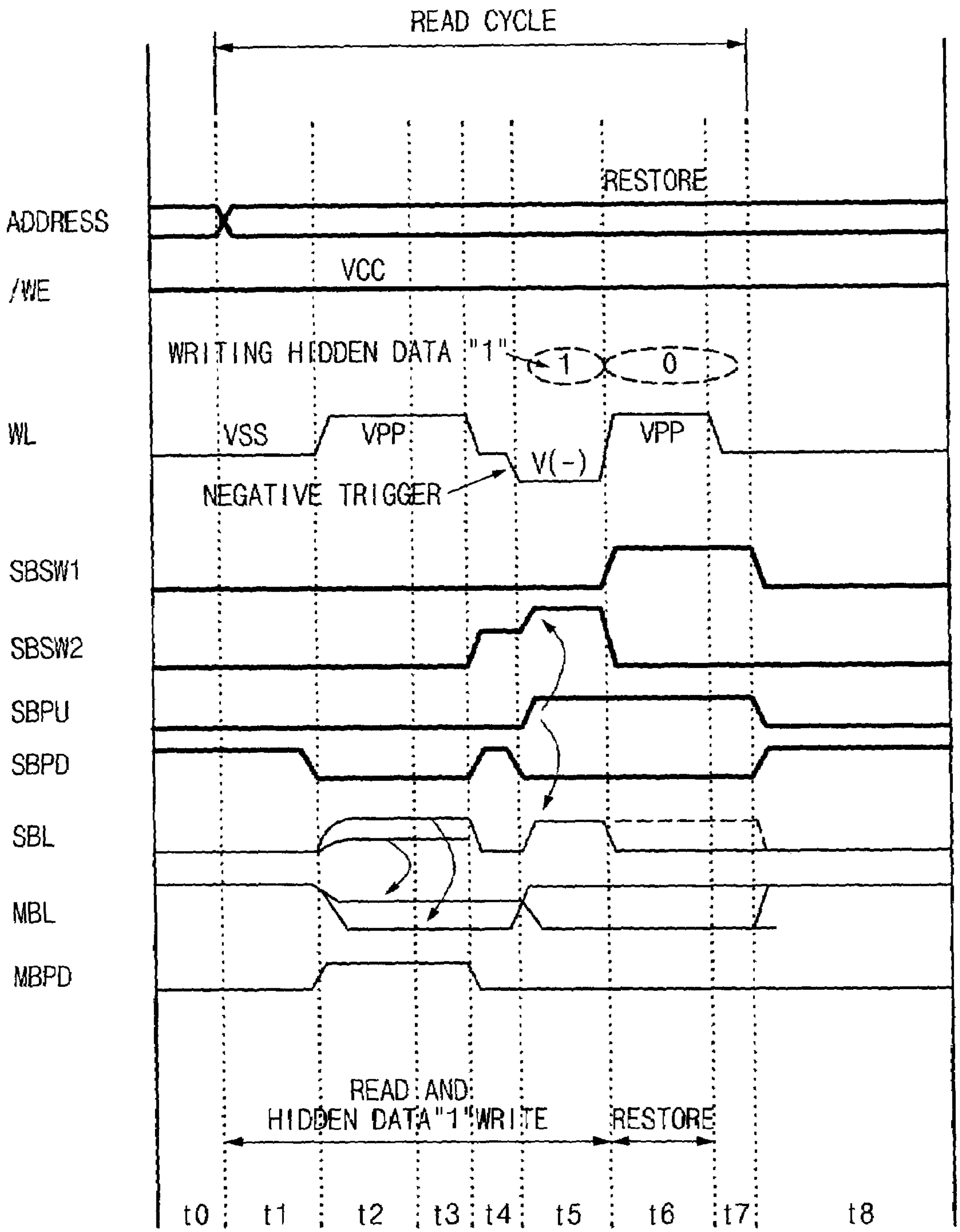
FIG. 11 is a timing diagram illustrating the read mode of the nonvolatile memory device using a serial diode cell according to an embodiment of the present invention.

FIG. 11 is a timing diagram illustrating the read mode of the nonvolatile memory device using a serial diode cell according to an embodiment of the present invention.

At the read mode, the write enable signal /WE is maintained at the power voltage VCC level. When a period t2 starts, if the word line WL is transited to the pumping VPP level, the PN diode 12 of the serial diode switch 10 is turned on. As a result, data of the serial diode cell C are transmitted to the sub bit line SBL and the main bit line MBL.

Here, the sub bit line pull-down signal SBPD is transited to 'low', and the main bit line pull-down signal MBPD is transited to 'high'. Then, the voltage levels of the sub bit line SBL and the main bit lien MBL rise, so that the data stored in the serial diode cell C can be read.

As described above, a nonvolatile memory device using a serial diode cell has the following effects: to provide a sub cell array using a serial diode switch which does not require an additional gate control signal in a hierarchical bit line structure including a main bit line and a sub bit line, thereby reducing the whole memory size; and to effectively drive read/write operations in the sub cell array using a serial diode switch, thereby improving operation characteristics of memory cells.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile memory device using a serial diode cell, comprising:

a plurality of serial diode cell arrays each having a hierarchical bit line structure including a main bit line and a sub bit line and each including a sub cell array having a plurality of unit serial diode cells arranged in row and column directions between a word line and the sub bit line;

a plurality of word line driving units for selectively driving the word lines of the plurality of serial diode cell arrays; and a plurality of sense amplifiers for sensing and amplifying data applied from the plurality of serial diode cell arrays, wherein each of the plurality of the serial diode cells comprises a nonvolatile ferroelectric capacitor whose one terminal is connected to the word line, and a serial diode switch which includes at least two or more diode devices successively connected in series between the sub bit line and the other terminal of the nonvolatile ferroelectric capacitor and is selectively switched depending on a voltage applied to the word line and the sub bit line.

2. The nonvolatile memory device according to claim 1, further comprising:

a plurality of local data buses connected one by one to the plurality of sense amplifiers;

a global data bus shared by the plurality of local data buses;

a plurality of data bus switches for selecting one of the plurality of local data buses to be connected to the global data bus;

a main amplifier for amplifying data applied from the global data bus;

a data buffer for buffering amplification data applied from the main amplifier; and an input/output port for externally outputting output data applied from the data buffer or applying externally applied input data to the data buffer.

3. The nonvolatile memory device according to claim 1, wherein each of the plurality of serial diode cell arrays comprises a plurality of sub cell arrays.

4. The nonvolatile memory device according to claim 3, wherein each of the plurality of sub cell arrays comprises:

a plurality of unit serial diode cells located where a plurality of word lines and a plurality of sub bit lines arranged in row and column directions are crossed;

a pull-up/pull-down driving switch for pulling up or pulling down the plurality of sub bit lines;

a first driving switch unit for controlling connection between the main bit line and the sub bit line; and a second driving switch unit for pulling down the main bit line.

5. The nonvolatile memory device according to claim 4, wherein the serial diode switch comprises:

a PN diode switch connected in a forward direction between the sub bit line and the other terminal of the nonvolatile ferroelectric capacitor; and a PNPN diode switch connected in a backward direction between the sub bit line and the other terminal of the nonvolatile ferroelectric capacitor.

6. The nonvolatile memory device according to claim 5, wherein the PN diode switch has a P-type region connected to the other terminal of the nonvolatile ferroelectric capacitor and a N-type region connected to the sub bit line.

7. The nonvolatile memory device according to claim 5, wherein the PNPN diode switch has an upper N-type region connected to the other terminal of the nonvolatile ferroelectric capacitor and a lower P-type region connected to the sub bit line.

8. The nonvolatile memory device according to claim 5, wherein when a voltage level of the word line is 'high' to turn on the PN diode switch, the serial diode switch is switched to read data stored in the nonvolatile ferroelectric capacitor, and when the voltage level of the word line is a negative voltage and the voltage level of the sub bit line is 'high' to turn on the PNPN diode switch, the serial diode switch is switched to write hidden data in the nonvolatile ferroelectric capacitor.

9. A nonvolatile memory device using a serial diode cell, comprising:

a plurality of serial diode cell arrays each having a hierarchical bit line structure including a main bit line and a sub bit line and each including a sub cell array having a plurality of unit serial diode cells arranged in row and column directions between a word line and the sub bit line, wherein the sub cell array comprises:

a unit serial diode cell including a nonvolatile ferroelectric capacitor whose one terminal is connected to the word line, and a serial diode switch which includes at least two or more diode devices successively connected in series between the sub bit line and the other terminal of the nonvolatile ferroelectric capacitor and is selectively switched depending on a voltage applied to the word line and the sub bit line;

a pull-up/pull-down driving switch for pulling up or pulling down the plurality of sub bit lines;

a first driving switch unit for controlling connection between the main bit line and the sub bit line; and a second driving switch unit for pulling down the main bit line.

10. The nonvolatile memory device according to claim 9, wherein the serial diode switch comprises:

a PN diode switch connected in a forward direction between the sub bit line and the other terminal of the nonvolatile ferroelectric capacitor; and a PNPN diode switch connected in a backward direction between the sub bit line and the other terminal of the nonvolatile ferroelectric capacitor.

11. The nonvolatile memory device according to claim 10, wherein the PN diode switch has a P-type region connected to the other terminal of the nonvolatile ferroelectric capacitor and a N-type region connected to the sub bit line.

12. The nonvolatile memory device according to claim 10, wherein the PNPN diode switch has an upper N-type region connected to the other terminal of the nonvolatile ferroelectric capacitor and a lower P-type region connected to the sub bit line.

13. The nonvolatile memory device according to claim 10, wherein when a voltage level of the word line is 'high' to turn on the PN diode switch, the serial diode switch is switched to read data stored in the nonvolatile ferroelectric capacitor, and when the voltage level of the word line is a negative voltage and the voltage level of the sub bit line is 'high' to turn on the PNPN diode switch, the serial diode switch is switched to write hidden data in the nonvolatile ferroelectric capacitor.

* * * * *